US009294064B2

(12) United States Patent
Song et al.

(10) Patent No.: US 9,294,064 B2
(45) Date of Patent: Mar. 22, 2016

(54) BANDPASS FILTER IMPLEMENTATION ON A SINGLE LAYER USING SPIRAL CAPACITORS

(71) Applicant: QUALCOMM Incorporated, San Diego, CA (US)

(72) Inventors: Young Kyu Song, San Diego, CA (US); Kyu-Pyung Hwang, San Diego, CA (US); Changhan Hobie Yun, San Diego, CA (US); Dong Wook Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 359 days.

(21) Appl. No.: 13/835,211

(22) Filed: Mar. 15, 2013

(65) Prior Publication Data

US 2014/0266508 A1 Sep. 18, 2014

(51) Int. Cl.
*H03H 7/01* (2006.01)
*H03H 7/12* (2006.01)
*H05K 1/16* (2006.01)
*H01G 4/40* (2006.01)
*H03H 3/00* (2006.01)

(52) U.S. Cl.
CPC ............... *H03H 7/0115* (2013.01); *H03H 7/12* (2013.01); *H05K 1/162* (2013.01); *H01G 4/40* (2013.01); *H03H 3/00* (2013.01); *H05K 2201/09236* (2013.01); *Y10T 29/43* (2015.01); *Y10T 29/49016* (2015.01)

(58) Field of Classification Search
CPC ..... H03H 7/12; H03H 7/0161; H03H 7/0115; H03H 2001/0085
USPC .................................. 333/175, 185; 361/271
See application file for complete search history.

(56) References Cited

U.S. PATENT DOCUMENTS

| 5,157,583 | A | * | 10/1992 | Clelland | 361/329 |
|---|---|---|---|---|---|
| 6,233,276 | B1 | * | 5/2001 | Simeon | 375/232 |
| 6,661,079 | B1 | | 12/2003 | Bikulcius | |
| 7,212,960 | B2 | * | 5/2007 | Quint et al. | 703/14 |
| 7,502,218 | B2 | | 3/2009 | Yang | |
| 7,838,919 | B2 | | 11/2010 | Okamoto et al. | |
| 2002/0122283 | A1 | * | 9/2002 | Higashi et al. | 361/271 |
| 2006/0141978 | A1 | * | 6/2006 | Liu | 455/333 |
| 2007/0181973 | A1 | | 8/2007 | Hung et al. | |
| 2014/0203404 | A1 | | 7/2014 | Choi et al. | |

OTHER PUBLICATIONS

Ong et al., "High-temperature superconducting bandpass spiral filter," IEEE Microwave and Guided Wave Letters, Oct. 1999, pp. 407-409.

* cited by examiner

*Primary Examiner* — Benny Lee
*Assistant Examiner* — Rakesh Patel
(74) *Attorney, Agent, or Firm* — Patterson & Sheridan, L.L.P.

(57) ABSTRACT

A planar capacitor includes, in part, a first metal line forming spiral-shaped loops around one of its end point, and a second metal line forming spiral-shaped loops between the loops of the first metal line. The first and second metal lines are coplanar, formed on an insulating layer, and form the first and second plates of the planar capacitor. The planar capacitor may be used to form a filter. Such a filter includes a first metal line forming first spiral-shaped loops, a second metal line forming second spiral-shaped loops, and a third metal line—coplanar with the first and second metal lines—forming loops between the loops of the first and second metal lines. The filter further includes a first inductor coupled between the first and third metal lines, and a second inductor coupled between the second and third metal lines.

36 Claims, 5 Drawing Sheets

BANDPASS FILTER IMPLEMENTATION ON A SINGLE LAYER USING SPIRAL CAPACITORS

BACKGROUND

The present disclosure relates to electronic circuits, and more particularly to a bandpass filter used in such filters.

Capacitors are widely used in electronic circuits to store charges and achieve the desired electrical functionality. For example, capacitors are used in filters to filter out frequencies that fall outside a desired range. As is well known, a capacitor includes two conductive plates separated from one another by a dielectric layer.

FIG. 1 is a top view of a conventional capacitor 10, commonly referred to as an interdigitated capacitor. Metal lines 12 and 14 form the plates of capacitor 10. Capacitor 10 is shown as having a height h and a length l. The width of metal lines 12, 14 is shown as being equal to w. The spacing between these metal lines is shown as being equal to g. Conventional capacitors, such as capacitor 10, consume a relatively large substrate area when used to form a bandpass filter operating at a radio frequency (RF).

SUMMARY

A planar capacitor, in accordance with one embodiment of the present invention, includes, in part, a first metal line forming spiral-shaped loops around one of its end point. The capacitor also includes a second metal line forming spiral-shaped loops around one of its end points. The loops of the second metal line are formed between the loops of the first metal line. The first and second metal lines are coplanar, formed on an insulating layer, and form the first and second plates of the planar capacitor.

In one embodiment, the width of each of the first and second metal lines is greater than a spacing between the first and second metal lines. In one embodiment, the insulating layer is formed above a semiconductor substrate. In another embodiment, the insulating layer is formed on a printed circuit board.

A filter, in accordance with one embodiment of the present invention, includes, in part, a first metal line forming spiral-shaped loops around one of its end points. The filter also includes, in part, a second metal line—coplanar with the first metal line—forming spiral-shaped loops around one of its end points. The first and second metal lines are formed on an insulating layer and respectively include first and second plates form the input and output terminals of the filter. The filter further includes, in part, a third metal line—coplanar with the first and second metal lines—that forms spiral-shaped loops between the loops of the first and second metal lines. The third metal line includes a third metal plates that forms a terminal common to the input and output of the filter. The filter further includes a first inductor coupled between the first and third metal lines, and a second inductor coupled between the second and third metal lines.

In one embodiment, the third metal line is coupled to a ground terminal. In one embodiment, the first metal line includes, in part, a first arm extending along a width of the first metal plate and terminating in a fourth metal plate. In such embodiments, the second metal line includes, in part, a second arm parallel to the first arm and terminating in a fifth metal plate parallel to the fourth metal plate. In on embodiment, the first, second and third metal plates have the same width.

In one embodiment, the width of the first and third metal lines in their associated spiral-shaped loops is greater than the spacing between the first and third metal lines in their associated spiral-shaped loops. The width of the second and third metal lines in their associated spiral-shaped loops is greater than a spacing between the second and third metal lines in their associated spiral-shaped loops. In one embodiment, the width of the fourth metal plate is greater than the length of the fourth metal plate, and the width of the fifth metal plate is greater than the length of the fifth metal plate.

In one embodiment, the fourth and fifth metal plates have the same length. In one embodiment, the fourth and fifth metal plates have the same width. In one embodiment, the length of the first and second inductors is greater than the width of the first and second metal plates. In one embodiment, the length of the first and second arms is smaller than the length of the outer loop of the first and second spiral-shaped loops.

A method of forming a planar capacitor, in accordance with one embodiment of the present invention, includes, in part, forming spiral-shaped loops using a first metal line, and forming spiral-shaped loops using a second metal line—coplanar with first metal line—between the loops of the first metal line. The first and second metal lines are formed on an insulating layer. In one embodiment, the width of the first and second metal lines is greater than their spacing. In one embodiment, the insulating layer is formed above a semiconductor substrate. In another embodiment, the insulating layer is formed on a printed circuit board.

A method of forming a filter, in accordance with one embodiment of the present invention, includes, in part, forming a first spiral-shaped loops using a first metal line, forming a second spiral-shaped loops using a second metal line, using a third metal line to form spiral-shaped loops between the loops of the first metal line and the loops of the second metal line, forming a first inductor between the first and third metal lines, and forming a second inductor between the second and third metal lines. The first, second, and third metal lines are formed on an insulating layer and respectively include first, second and third plates forming the input terminal, output terminal, and a common terminal of the filter.

In one embodiment, the third metal line is coupled to the ground terminal. In one embodiment, the method further includes, in part, forming a first metal arm using the first metal line that extends along the width of the first metal plate and terminates in a fourth metal plate. The method further includes, forming a second metal arm using the second metal line that extends along the width of the second metal plate and terminates in a second metal plate.

In one embodiment, the first, second and third metal plates have the same width. In one embodiment, the width of the first and third metal lines in their associated spiral-shaped loops is greater than the spacing between the first and third metal lines in their associated spiral-shaped loops. The width of the second and third metal lines in their associated spiral-shaped loops is greater than the spacing between the second and third metal lines in their associated spiral-shaped loops.

In one embodiment, the width of the fourth metal plate is greater than the length of the fourth metal plate, and the width of the fifth metal plate is greater than the length of the fifth metal plate. In one embodiment, the fourth and fifth metal plates have the same length. In one embodiment, the fourth and fifth metal plates have the same width. In one embodiment, the length of the first and second inductors is greater than the width of the first and second metal plates. In one embodiment, the length of the first and second arms is smaller than the length of the outer loops of the first and second spiral-shaped loops.

BRIEF DESCRIPTION OF THE DRAWINGS

Aspects of the disclosure are illustrated by way of example. In the accompanying figures, like reference numbers indicate similar elements, and.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure.

Figure 2:
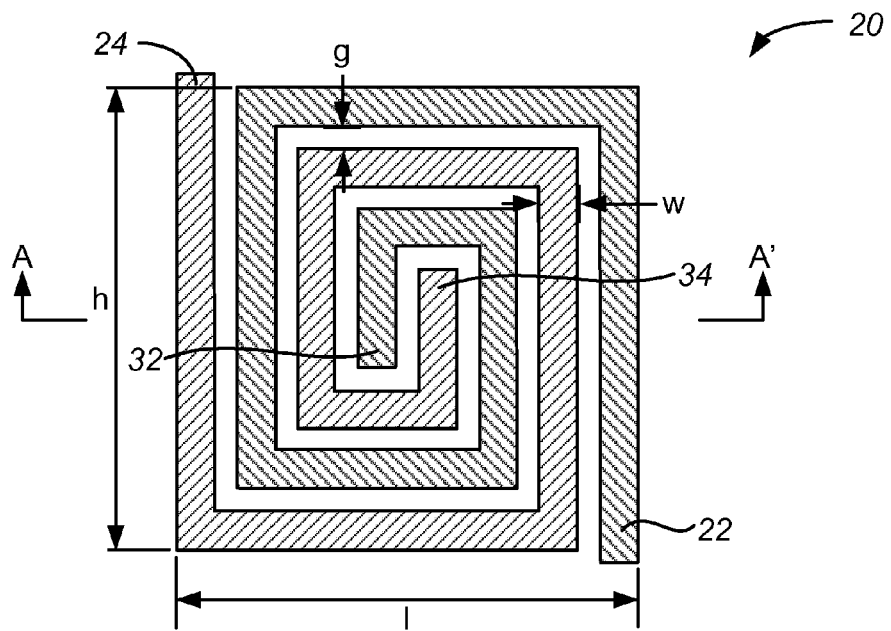
FIG. 2 is a top view of a spiral-shaped planar capacitor, in accordance with one embodiment of the present invention.
Figure 3:
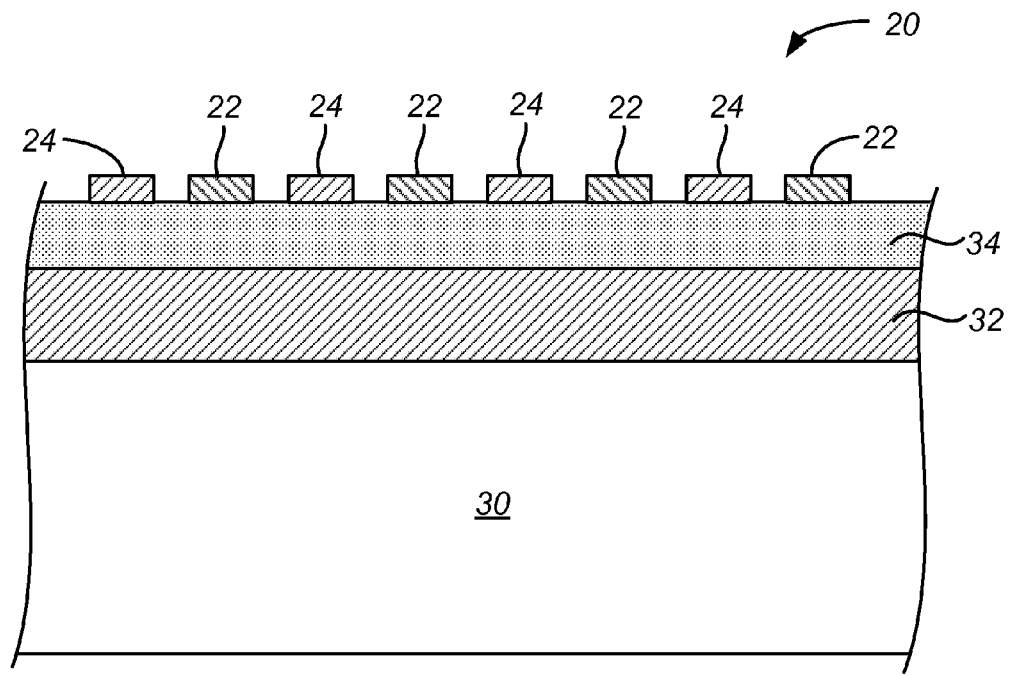
FIG. 3 is a cross-sectional view of the capacitor of FIG. 2, in accordance with one embodiment of the present invention.

FIG. 2 is a top view of a capacitor 20, in accordance with one embodiment of the present invention. As shown, capacitor 20 has two spiral arms 22 and 24 that are intertwined and form its two conductive plates. In accordance with the present invention, conductive plates 22, 24 are formed on the same insulating layer of a semiconductor substrate and are thus coplanar.

FIG. 2 is a simplified cross-sectional view of capacitor 20 along lines AA'. Semiconductor substrate 30 is shown as including a multitude of layers collectively referred to as 32 and an insulating layer 34 over which the two conductive layers 22 and 24 of capacitor 20 are formed. Since conductive layers 22 and 24 of capacitor 20 are formed using the same metal deposition and patterning step and over the same insulating layer 34, conductive layers 22 and 24 are coplanar. It is understood that layer 32 may include many more layers not shown for simplicity.

Figure 1:
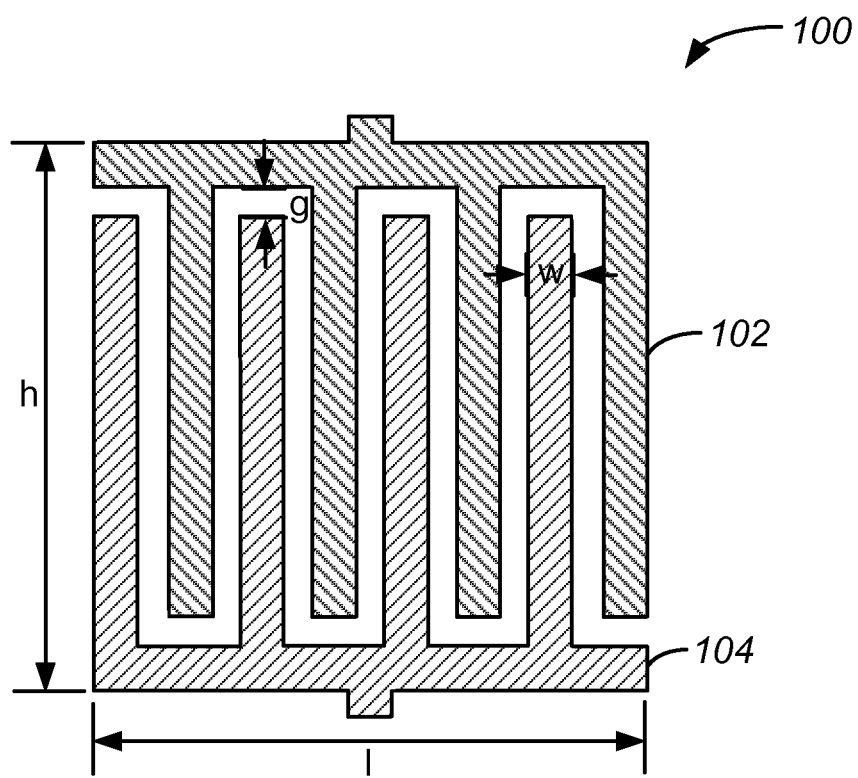
FIG. 1 is a top view of a conventional interdigitated capacitor, as known in the prior art.

As is seen from FIG. 2, first and second conductive plates 22 and 24 are formed using spiral-shaped metal lines that are intertwined. Accordingly, the metal line (trace) of first conductive plate 22 forms spiral-shaped loops around its end point 32. Likewise, the metal line of second conductive plate 24 forms spiral-shaped loops around its end point 34. As is further seen from FIG. 2, the loops of the first metal line are formed between the loops of the second metal line, and the loops of the first second line are formed between the loops of the first metal line. Capacitor 20 advantageously has a higher capacitance per unit area than conventional integrated capacitors, such as interdigitated capacitor 10 of FIG. 1.

As described above, in one embodiment, capacitor 20 is formed on an insulation layer present on a semiconductor substrate used to manufacture an integrated circuit. In another embodiment, capacitor 20 may be formed on any other substantially planar insulation layer, such as a printed circuit board (PCB). Capacitor 20 has a lower self-resonance and thus a higher effective capacitance than similarly sized conventional capacitors. The width of metal lines 22 and 24 is shown as being equal to w. The spacing between these metal lines is shown as being equal to g. In one embodiment w is greater than g. In one embodiment, capacitor 20 is used in a radio frequency (RF) communication circuit. In one example, the width w of metal lines 22, 24 is 83 µm, and the spacing g between metal lines 22, 24 is 48 µm.

Figure 4:
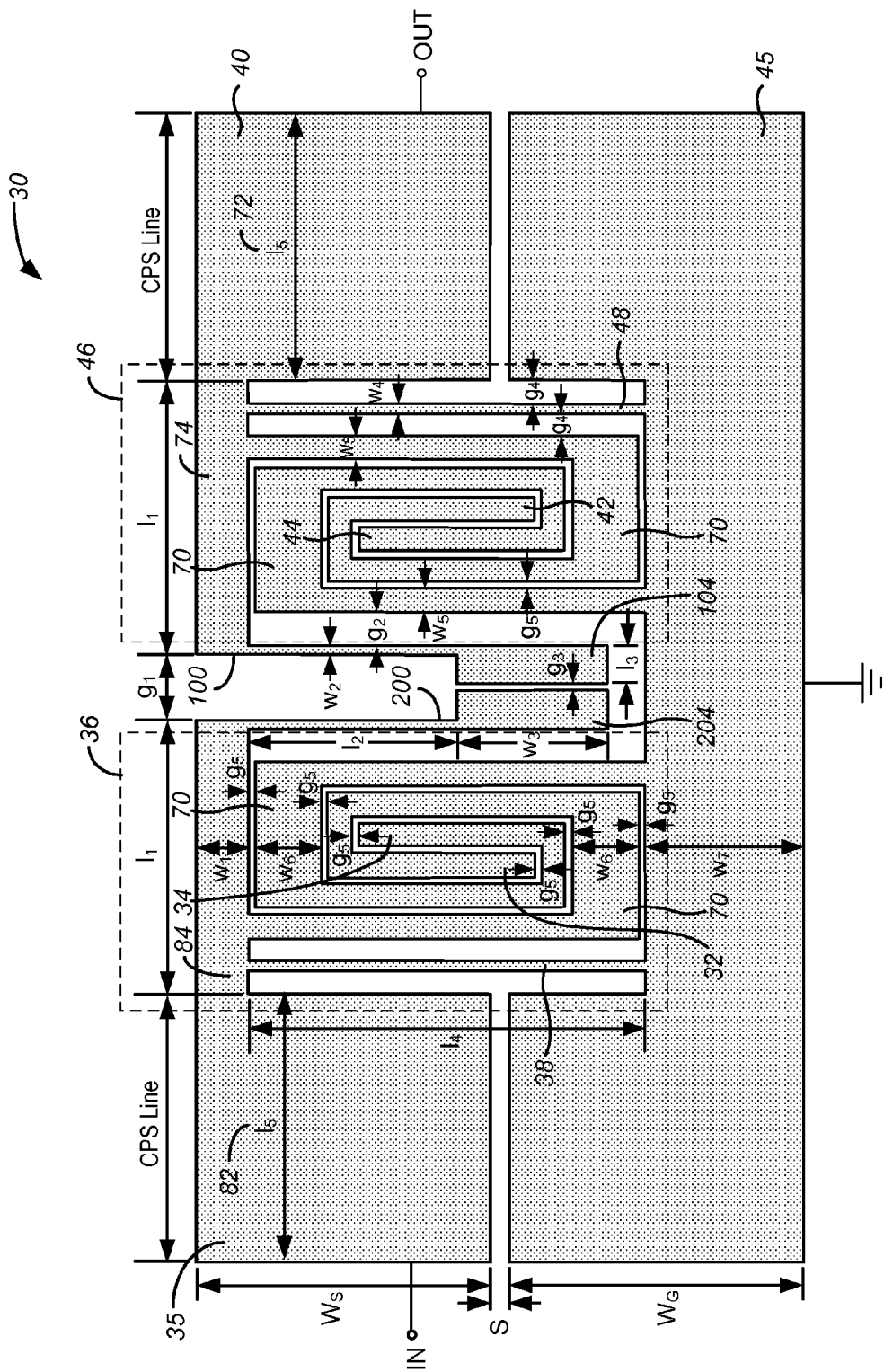
FIG. 4 is a top view of a filter formed using a pair of spiral planar capacitors, in accordance with one embodiment of the present invention.

FIG. 4 is a top view of a bandpass filter 30 formed using a pair of spiral planar capacitors, such as spiral capacitor 20 shown in FIG. 2, in accordance with one embodiment of the present invention. Metal plates 40 and 45 form the conductive plates of the first spiral planar capacitor, and metal plates 35 and 45 form the conductive plates of the second spiral planar capacitor. Bandpass filter 30 includes, in part, an input terminal coupled to metal plate 35 and an output terminal coupled to metal plate 40. Metal plate 40 is shown as having a first region 72 having a length $l_5$ defining a first coplanar strip line (CPS line) and a second region 74 having a length $l_1$ and a width of $w_1$. Likewise, metal plate 45 is shown as having a first region 82 having a length $l_5$ defining a second coplanar strip line and a second region 84 having the same length $l_1$ and width of $w_1$ as region 74. The spacing between regions 74, 84 is shown as being equal to $g_1$. Metal plate 45 that is common to both spiral capacitors receives a supply voltage, such as the ground potential.

Metal plates 35, 40 are shown as having a width of $W_s$ in regions 72, 82 respectively. Metal plate 45 is shown as having a width of $W_g$ near the areas positioned adjacent metal plates 35, 40; and a width of $w_7$ near the areas positioned adjacent regions 36, 46 in which the spiral arms are formed. Metal plates 35 and 45 are shown as being separated by distance S. Likewise, metal plates 40 and 45 are shown as being separated by the same distance S.

As is seen, the metal lines of conductive plates 40 and 45 form spiral-shaped loops around their end point 42 and 44 within the region defined by dashed perimeter line 46. Accordingly, within region 46, the loops of the conductive plate 42 are formed between the loops of conductive plate 45. Likewise, the metal lines of conductive plates 35 and 45 form spiral-shaped loops around their end point 32 and 34 within the region defined by dashed perimeter line 36. Accordingly, within region 36, the loops of the conductive plate 35 are formed between the loops of conductive plate 45. Each of the spiral-shaped loops also forms an inductor with the characteristics of a capacitor at below resonant frequency. As seen from FIG. 4, the metal lines of the conductive loops are selected to be wider in the outer areas 70 of the loops than the inner areas of the loops. Accordingly, in the outer areas of the loops the metal lines are shown as having a width of $w_6$, whereas in the inner areas of the loops the metal lines are shown as having a width of $w_5$. The spacing between the metal lines in the loops is shown as being equal to $g_5$.

Metal strip 38 connecting metal plates 35 and 45, as well as metal strip 48 connecting metal plates 40 and 45 operate as inductors when a signal applied to input terminal IN of capacitor 30 is a radio frequency (RF) signal. In the embodiment shown in FIG. 4, metal strip (also referred to herein as inductor) 38 as well as inductor 48 have the same length $l_4$ and same width $w_4$ selected so as to achieve the desired inductance value for inductors 38, 48. Inductors 38 and 48 are positioned at a distance $g_4$ from the nearest metal traces of conductive plates 35, 40 and 45.

Metal plate 45 is shown as having an arm 100 extending from region 74 along the width of metal plate 35 and terminating in plate 104. Likewise, metal plate 35 is shown as having an arm 200 extending from region 84 along the width of metal plate 45 and terminating in plate 204. Each metal arm is shown as having a length of $l_2$ and a width of $w_2$. The spacing between metal arms 100, 200 is shown as being equal to g.sub.1. Each of metal plates 104, 204 is shown as having a length of $l_3$ and a width of $w_3$. The spacing between metal plates 104, 204 is shown as being equal to $g_3$. It is understood that the metal lines in bandpass filter 30 include inductor(s) and/or impedance(s) required for the proper operation of the filter.

Table I below shows various dimensions of bandpass filter 30 adapted to operate in UNIT band in a CPS line and formed on an alumina substrate having gold electrodes which have a thickness of 500 nm, in accordance with one exemplary embodiment of the present invention. The bandpass filter whose dimensions are shown in table I has an area of 1.7 mm×1.7 mm.

TABLE I

| Dimension | Size |
| --- | --- |
| $W_s$ | 825 μm |
| $W_g$ | 825 μm |
| S | 51 μm |
| $l_1$ | 760 μm |
| $l_2$ | 580 μm |
| $l_3$ | 113 μm |
| $l_1$ | 760 μm |
| $l_4$ | 1105 μm |
| $w_1$ | 150 μm |
| $w_2$ | 30 μm |
| $w_3$ | 425 μm |
| $w_4$ | 30 μm |
| $w_5$ | 70 μm |
| $w_6$ | 190 μm |
| $w_7$ | 445 μm |
| $g_1$ | 180 μm |
| $g_2$ | 85 μm |
| $g_3$ | 15 μm |
| $g_4$ | 60 μm |
| $g_5$ | 15 μm |

Figure 7:
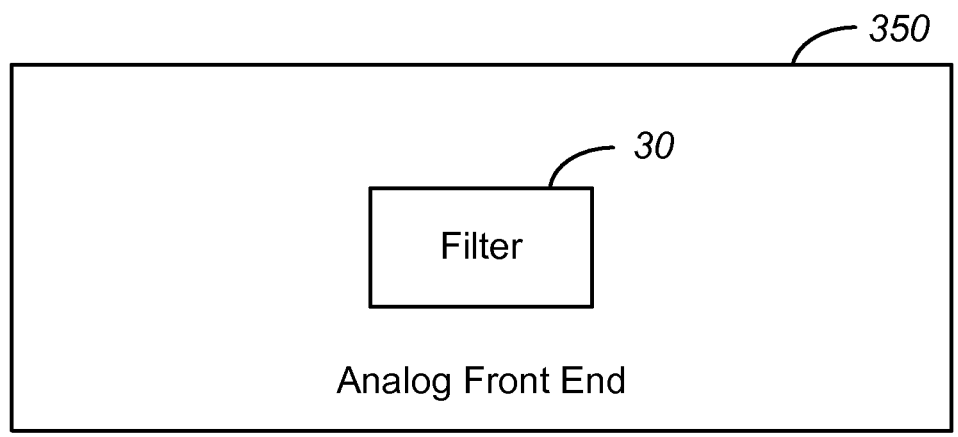
FIG. 7 shows an analog front end circuit having disposed therein the filter of FIG. 4, in accordance with one embodiment of the present invention.

In one embodiment, bandpass filter 30 is formed on an insulating layer present on a semiconductor substrate used to manufacture an integrated circuit. In another embodiment, bandpass filter 30 is formed on any other substantially planar insulating layer, such as on a PCB. In one embodiment, bandpass filter 30 is used in an RF circuit having an operating frequency in the range of 4-5 GHz. Filter 30 may be used in an analog front end circuit. For example, FIG. 7 shows an analog front end circuit 350 that includes filter 30 of FIG. 4.

Figure 5:
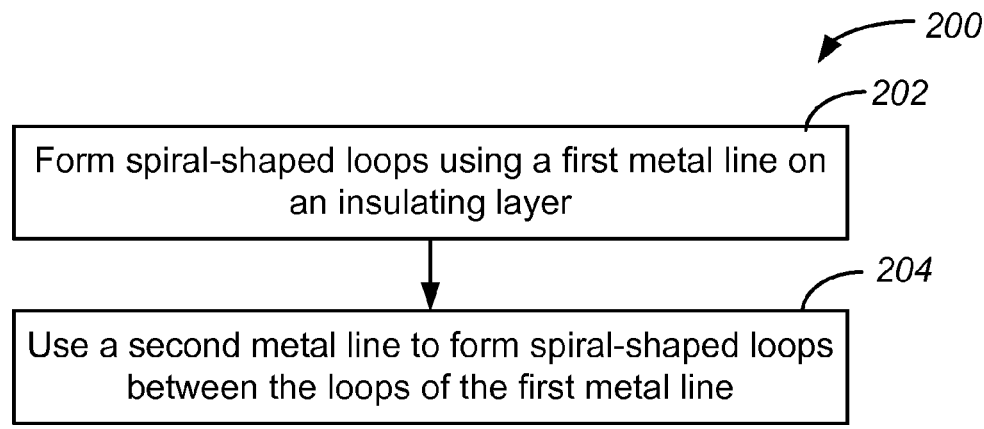
FIG. 5 is a flowchart of a method for forming a spiral-shaped planar capacitor, in accordance with one embodiment of the present invention.

FIG. 5 is a flowchart 200 showing a method for forming a planar capacitor, in accordance with one embodiment of the present invention. To form the planar capacitor, spiral-shaped loops are formed 202 on an insulating layer using a first metal line. A second metal line—coplanar with the first metal line—is used to form 204 spiral-shaped loops between the loops of the first metal line. The first and second metal lines form the first and second plates of the planar capacitor. The insulating layer may be a layer formed over a semiconductor substrate, printed circuit board, or any other substrate.

Figure 6:
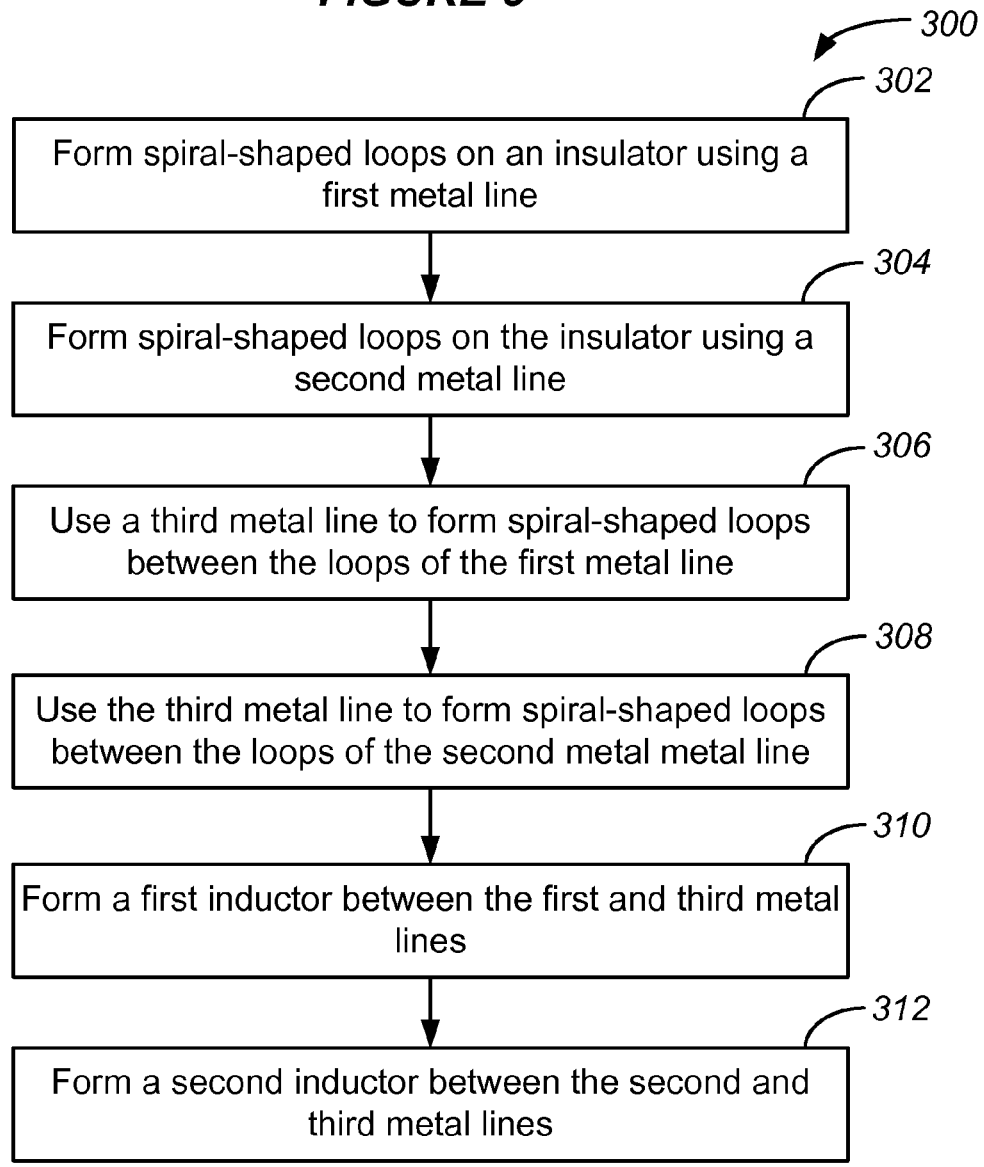
FIG. 6 is a flowchart of a method for forming a filter having spiral-shaped capacitor loops, in accordance with one embodiment of the present invention.

FIG. 6 is a flowchart 300 showing a method for forming a filter, in accordance with one embodiment of the present invention. To form the filter which has coplanar conductive plates, spiral-shaped loops are formed 302 on an insulating layer using a first metal line. A second metal line—coplanar with the first metal line—is used to form 304 another spiral-shaped loops on the insulating layer. A third metal line—coplanar with the first and second metal lines—is used to form 306 spiral-shaped loops between the loops of the first metal line. The third metal line is also used to form 308 spiral-shaped loops between the loops of second metal line. A first inductor is formed 310 between the first and third metal lines 310. A second inductor is formed 312 between the second and third metal lines. The first and second metal lines respectively form the input and output terminals of the filter. The third metal lines is common to both the input as well as the output of the filter and may receive the ground potential. The filter is adapted to operate at radio frequencies.

The above embodiments of the present invention are illustrative and not limitative. The embodiments of the present invention are not limited by the process used to form or planarize the metal lines of the capacitor or filter. Other additions, subtractions or modifications are obvious in view of the present disclosure and are intended to fall within the scope of the appended claims.

What is claimed is:

1. A filter comprising:
a first metal line formed on an insulating layer, said first metal line forming spiral-shaped loops around a first end of the first metal line, said first metal line comprising a first metal plate forming an input terminal of the filter;
a second metal line formed on the insulating layer, said second metal line forming spiral-shaped loops around a first end of the second metal line, said second metal line comprising a second metal plate forming an output terminal of the filter;
a third metal line formed on the insulating layer, said third metal line forming first spiral-shaped loops between the loops of the first metal line and said third metal line forming second spiral-shaped loops between the loops of the second metal line, said third metal line comprising a third metal plate forming a ground terminal;
a first inductor coupled between the first and third metal lines; and
a second inductor coupled between the second and third metal lines, wherein said first, second and third metal plates have a same width.

2. The filter of claim 1 wherein said first metal line comprises a first arm extending along the width of the first metal plate and terminating in a fourth metal plate, and wherein said second metal line comprises a second arm parallel to the first arm and terminating in a fifth metal plate parallel to the fourth metal plate.

3. The filter of claim 2 wherein a length of the first and second arms is smaller than a length of an outer loop of each of the spiral-shaped loops of the first and second metal lines.

4. The filter of claim 2 wherein a width of the fourth metal plate is greater than a length of the fourth metal plate, and wherein a width of the fifth metal plate is greater than a length of the fifth metal plate.

5. The filter of claim 4 wherein said fourth and fifth metal plates have the same length.

6. The filter of claim 5 wherein said fourth and fifth metal plates have the same width.

7. The filter of claim 1 wherein said filter is disposed in an analog front end circuit.

8. The filter of claim 1 wherein a length of each of the first and second inductors is greater than the width of each of the first and second metal plates.

9. The filter of claim 1 wherein a width of the first metal line and a width of the third metal line in the respective associated spiral-shaped loops are greater than a spacing between the first and third metal lines in the respective associated spiral-shaped loops, and wherein a width of the second metal line and the width of the third metal line in the respective associated spiral-shaped loops are greater than a spacing between the second and third metal lines in the respective associated spiral-shaped loops.

10. A non-transitory computer readable storage medium comprising instructions that when executed by a processor cause the processor to:
   form a first metal line on an insulating layer, said first metal line forming spiral-shaped loops around a first end thereof, said first metal line comprising a first metal plate forming an input terminal of a filter;
   form a second metal line on the insulating layer, said second metal line forming spiral-shaped loops around a first end thereof, said second metal line comprising a second metal plate forming an output terminal of the filter;
   form a third metal line on the insulating layer, said third metal line forming first spiral-shaped loops between the loops of the first metal line and said third metal line forming second spiral-shaped loops between the loops of the second metal line, said third metal line comprising a third metal plate forming a ground terminal;
   form a first inductor between the first and third metal lines; and
   form a second inductor between the second and third metal lines, thereby to form the filter, wherein said first, second and third metal plates have a same width.

11. The non-transitory computer readable storage medium of claim 10 wherein a width of the first metal line and a width of the third metal line in the respective associated spiral-shaped loops are greater than a spacing between the first and third metal lines in the respective associated spiral-shaped loops, and wherein a width of the second metal line and the width of the third metal line in the respective associated spiral-shaped loops are greater than a spacing between the second and third metal lines in the respective associated spiral-shaped loops.

12. The non-transitory computer readable storage medium of claim 10 wherein a length of each of the first and second inductors is greater than the width of each of the first and second metal plates.

13. The non-transitory computer readable storage medium of claim 10 wherein said instructions further cause the processor to:
   dispose the filter in an analog front end circuit.

14. The non-transitory computer readable storage medium of claim 10 wherein said instructions further cause the processor to:
   form a first metal arm by extending the first metal line along the width of the first metal plate;
   terminate the first metal arm in a fourth metal plate; and
   form a second metal arm by extending the second metal line along the width of the second metal plate; and
   terminate the second metal arm in a fifth metal plate.

15. The non-transitory computer readable storage medium of claim 14 wherein a length of the first and second arms is smaller than a length of an outer loop of each of the spiral-shaped loops of the first and second metal lines.

16. The non-transitory computer readable storage medium of claim 14 wherein a width of the fourth metal plate is greater than a length of the fourth metal plate, and wherein a width of the fifth metal plate is greater than a length of the fifth metal plate.

17. The non-transitory computer readable storage medium of claim 16 wherein said fourth and fifth metal plates have the same length.

18. The non-transitory computer readable storage medium of claim 16 wherein said fourth and fifth metal plates have the same width.

19. A method of forming a filter, the method comprising:
   forming a first metal line on an insulating layer, said first metal line forming spiral-shaped loops around a first end thereof, said first metal line comprising a first metal plate forming an input terminal of the filter;
   forming a second metal line on the insulating layer, said second metal line forming spiral-shaped loops around a first end thereof, said second metal line comprising a second metal plate forming an output terminal of the filter;
   forming a third metal line on the insulating layer, said third metal line forming first spiral-shaped loops between the loops of the first metal line and said third metal line forming second spiral-shaped loops between the loops of the second metal line, said third metal line comprising a third metal plate forming a ground terminal;
   forming a first inductor between the first and third metal lines; and
   forming a second inductor between the second and third metal lines, wherein said first, second and third metal plates have a same width.

20. The method of claim 19 further comprising:
   disposing the filter in an analog front end circuit.

21. The method of claim 19 wherein a length of each of the first and second inductors is greater than the width of each of the first and second metal plates.

22. The method of claim 19 further comprising:
   forming a first metal arm by extending the first metal line along the width of the first metal plate;
   terminating the first metal arm in a fourth metal plate; and
   forming a second metal arm by extending the second metal line along the width of the second metal plate; and
   terminating the second metal arm in a fifth metal plate.

23. The method of claim 22 wherein a length of the first and second arms is smaller than a length of an outer loop of each of the spiral-shaped loops of the first and second metal lines.

24. The method of claim 22 wherein a width of the fourth metal plate is greater than a length of the fourth metal plate, and wherein a width of the fifth metal plate is greater than a length of the fifth metal plate.

25. The method of claim 24 wherein said fourth and fifth metal plates have the same width.

26. The method of claim 24 wherein said fourth and fifth metal plates have the same length.

27. The method of claim 19 wherein a width of the first metal line and a width of the third metal line in the respective associated spiral-shaped loops are greater than a spacing between the first and third metal lines in the respective associated spiral-shaped loops, and wherein a width of the second metal line and the width of the third metal lines in the respective associated spiral-shaped loops are greater than a spacing between the second and third metal lines in the respective associated spiral-shaped loops.

28. An apparatus comprising:
   means for forming a first metal line on an insulating layer, said first metal line forming spiral-shaped loops around a first end thereof, said first metal line comprising a first metal plate forming an input terminal of a filter;
   means for forming a second metal line on the insulating layer, said second metal line forming spiral-shaped loops around a first end thereof, said second metal line comprising a second metal plate forming an output terminal of the filter;

means for forming a third metal line on the insulating layer, said third metal line forming first spiral-shaped loops between the loops of the first metal line and said third metal line forming second spiral-shaped loops between the loops of the second metal line, said third metal line comprising a third metal plate forming a ground terminal;

means for forming a first inductor between the first and third metal lines; and means for forming a second inductor between the second and third metal lines, wherein said first, second and third metal plates have a same width.

29. The apparatus of claim 28 wherein a length of each of the first and second inductors is greater than the width of each of the first and second metal plates.

30. The apparatus of claim 28 wherein a width of the first metal line and a width of the third metal line in the respective associated spiral-shaped loops are greater than a spacing between the first and third metal lines in the respective associated spiral-shaped loops, and wherein a width of the second metal line and the width of the third metal line in the respective associated spiral-shaped loops are greater than a spacing between the second and third metal lines in the respective associated spiral-shaped loops.

31. The apparatus of claim 28 further comprising:

means for forming a first metal arm by extending the first metal line along the width of the first metal plate;

means for terminating the first metal arm in a fourth metal plate;

means for forming a second metal arm by extending the second metal line along the width of the second metal plate; and means for terminating the second metal arm in a fifth metal plate.

32. The apparatus of claim 31 wherein a length of the first and second arms is smaller than a length of an outer loop of each of the spiral-shaped loops of the first and second metal lines.

33. The apparatus of claim 31 wherein a width of the fourth metal plate is greater than a length of the fourth metal plate, and wherein a width of the fifth metal plate is greater than a length of the fifth metal plate.

34. The apparatus of claim 33 wherein said fourth and fifth metal plates have the same length.

35. The apparatus of claim 33 wherein said fourth and fifth metal plates have the same width.

36. The apparatus of claim 28 further comprising:

means for disposing the filter in an analog front end circuit.

* * * * *